United States Patent

Iyama et al.

[11] Patent Number: 6,111,480
[45] Date of Patent: Aug. 29, 2000

[54] PIEZOELECTRIC RESONATOR AND METHOD OF ADJUSTING RESONANT FREQUENCY THEREOF

[75] Inventors: Kiyoshi Iyama, Himi; Toshihiko Unami, Omihachiman, both of Japan

[73] Assignee: Murata Manfacturing Co., Ltd., Japan

[21] Appl. No.: 09/110,304

[22] Filed: Jul. 6, 1998

[30] Foreign Application Priority Data

Jul. 7, 1997 [JP] Japan ................................. 9-197824

[51] Int. Cl.⁷ .......................... H03H 9/15; H03H 9/54
[52] U.S. Cl. .................. 333/188; 310/312; 310/359; 310/366; 310/367; 333/187
[58] Field of Search ............................ 333/186–191; 310/311, 312, 320, 321, 322, 323, 334, 357, 358, 359, 366, 367

[56] References Cited

U.S. PATENT DOCUMENTS

| | | | |
|---|---|---|---|
| 3,590,287 | 6/1971 | Berlincourt et al. | 333/177 X |
| 4,564,782 | 1/1986 | Ogawa | 333/191 X |
| 4,759,107 | 7/1988 | Ogawa et al. | 310/366 X |
| 4,900,970 | 2/1990 | Ando et al. | 310/366 X |
| 4,939,403 | 7/1990 | Kittaka et al. | 310/366 X |
| 5,118,982 | 6/1992 | Inoue et al. | 310/366 |
| 5,153,477 | 10/1992 | Jomura et al. | 310/366 X |
| 5,426,401 | 6/1995 | Ogawa et al. | 333/189 X |
| 5,736,911 | 4/1998 | Watanabe | 333/188 |
| 5,825,262 | 10/1998 | Inoue et al. | 333/189 |

FOREIGN PATENT DOCUMENTS

| | | | |
|---|---|---|---|
| 53-79396 | 7/1978 | Japan | 310/312 |
| 53-90893 | 8/1978 | Japan | 310/312 |
| 7-297662 | 11/1995 | Japan | 310/312 |

*Primary Examiner*—Robert Pascal
*Assistant Examiner*—Barbara Summons
*Attorney, Agent, or Firm*—Graham & James LLP

[57] ABSTRACT

A piezoelectric resonator having a small spurious resonance and a large difference ΔF between the resonant frequency and the antiresonant frequency is constructed that a resonant frequency or antiresonant frequency can be easily and accurately adjusted to a low frequency. The piezoelectric resonator has a base member which includes a plurality of laminated piezoelectric layers and a plurality of inner electrodes disposed substantially perpendicularly to the longitudinal direction of the base member. The plurality of piezoelectric layers are polarized in the longitudinal direction of the base member. A first external electrode and a second external electrode are located on a surface of the base member and connected to the plurality of electrodes. The resonant frequency of the piezoelectric resonator is adjusted by cutting an intermediate portion in the longitudinal direction of the base member.

17 Claims, 12 Drawing Sheets

14  12a 14  12a

PIEZOELECTRIC RESONATOR AND METHOD OF ADJUSTING RESONANT FREQUENCY THEREOF

BACKGROUND OF THE PRESENT INVENTION

1. Technical Field of the Invention

The present invention relates to piezoelectric resonators and methods for adjusting resonant frequencies thereof, and more particularly, to a piezoelectric resonator which maximizes the use of a mechanical resonance of a piezoelectric member and electronic components including such a piezoelectric resonator, such as an oscillator, a discriminator, and a filter, and methods of adjusting resonant frequencies of piezoelectric resonators contained in such electronic components.

2. Description of the Related Art

In a conventional piezoelectric resonator, electrodes are located on both surfaces of a piezoelectric substrate which has a rectangular plate shape or a square plate shape as viewed from above. The piezoelectric substrate is polarized in the thickness direction. When a signal is input between the electrodes, an electric field is applied to the piezoelectric substrate in the thickness direction and the piezoelectric substrate vibrates in a direction which is parallel to the major surfaces thereof.

The piezoelectric resonator described above is an unstiffened type, in which the vibration direction differs from the direction of polarization and the direction of application of electric field. The electromechanical coupling coefficient of such an unstiffened piezoelectric resonator is lower than that of a stiffened piezoelectric resonator, in which the vibration direction, the direction of polarization, and the direction in which an electric field is applied are the same. Therefore, an unstiffened piezoelectric resonator has a relatively small frequency difference ΔF between the resonant frequency and the antiresonant frequency. This causes a frequency bandwidth in use to be undesirably narrow when an unstiffened frequency resonator is used as an oscillator or a filter. Therefore, the degree of freedom in resonator characteristics and filter design is low in such a piezoelectric resonator and electronic components including such a piezoelectric resonator.

The piezoelectric resonator described above, which uses the piezoelectric substrate having a rectangular plate shape as viewed from above, uses a first-order resonance in the longitudinal mode. As a result of its structure, it also generates large spurious resonances in odd-order harmonic modes, such as the third-order and fifth-order modes, and in the width mode.

The piezoelectric resonator described above, which uses the piezoelectric substrate having a square plate shape as viewed from above, uses the first-order resonance in the longitudinal mode. As a result of its structure, this resonator is also likely to generate large spurious resonances, such as in the thickness mode, and to generate a third harmonic in the square vibration mode.

There has been proposed a laminated piezoelectric resonator having small spurious resonance and a large difference ΔF between the resonant frequency and the antiresonant frequency. FIG. 20 is a view of such a laminated piezoelectric resonator. In the laminated piezoelectric resonator 1 shown in FIG. 20, a plurality of piezoelectric layers 3 and a plurality of inner electrodes 4 are alternately laminated to form a narrow base member 2, and each of the plurality of piezoelectric layers 3 is polarized in the longitudinal direction of the base member 2. This laminated piezoelectric resonator 1 is a stiffened type, and includes piezoelectric layers 3 in which the vibration direction, the direction of polarization, and the direction in which an electric field is applied are the same. Therefore, as compared with an unstiffened piezoelectric resonator, in which the vibration direction differs from the direction of polarization and electric field, the stiffened piezoelectric resonator has a larger electromechanical coupling coefficient and a larger frequency difference ΔF between the resonant frequency and the antiresonant frequency. In addition, since this laminated piezoelectric resonator 1 is a stiffened type, vibrations in modes such as the width mode and the thickness mode, which are different from the fundamental vibration, are unlikely to occur. In this laminated piezoelectric resonator 1, the edges of the inner electrodes 4 are exposed at all side surfaces of the base member 2. At one side surface of the base member 2, an insulating film 5a covers one end of an edge of each alternate inner electrode 4, and an external electrode 6a is formed so as to connect to the other alternate inner electrodes 4. On the side surface of the base member 2, in order for an external electrode 6b to be connected to the alternate inner electrodes 4 for which the insulating film 5a is formed, an insulating film 5b covers the other end of an edge of each of the other alternate inner electrodes 4 and then, an external electrode 6b is formed.

When the laminated piezoelectric resonator 1 shown in FIG. 20 is mass-produced, the desired resonant frequency and the desired antiresonant frequency cannot be obtained in some cases due to manufacturing variations. If the frequency of the piezoelectric resonator 1 is lower than the desired frequency, the frequency can be increased to the desired frequency by cutting off a portion of the resonator at an end thereof such that the total length of the resonator is decreased. If the frequency of the piezoelectric resonator 1 is higher than the desired frequency, however, the frequency cannot be reduced to the desired frequency. Therefore, manufacturing yield is low.

SUMMARY OF THE INVENTION

To overcome the problems described above, the preferred embodiments of the present invention provide a piezoelectric resonator having a small spurious resonance and a large difference ΔF between the resonant frequency and the antiresonant frequency, and in which the frequency has been adjusted to a low frequency which is desired.

The preferred embodiments of the present invention also provide a method of adjusting a resonant frequency of a piezoelectric resonator, in which the frequency of a piezoelectric resonator having a small spurious resonance and a large difference ΔF between the resonant frequency and the antiresonant frequency can be adjusted to a low frequency.

According to a preferred embodiment of the present invention, a piezoelectric resonator includes a base member having a longitudinal direction; a plurality of inner electrodes disposed substantially perpendicularly to the longitudinal direction of the base member at intervals in the longitudinal direction of the base member; and a first external electrode and a second external electrode located on a surface of the base member and connected to the plurality of electrodes; wherein the base member includes a plurality of laminated piezoelectric layers, the plurality of piezoelectric layers are polarized in the longitudinal direction of the base member, and the plurality of inner electrodes are located on surfaces of the plurality of piezoelectric layers so as to be substantially perpendicular to the longitudinal direction of the base member; and a cut is provided in an intermediate portion of the base member such that the resonant frequency of the piezoelectric resonator is adjusted by the cut.

The cut is preferably provided on a surface of the base member which is disposed opposite to a surface upon which the first and second external electrodes are located.

In addition, the cut is arranged to extend in a direction that is substantially perpendicular to the longitudinal direction of the base member and may comprise a substantially rectangular cut portion, a substantially arc-shaped cut portion or other suitable shaped cut portions.

In the piezoelectric resonator according to this preferred embodiment, the intermediate portion in the longitudinal direction of the base member is preferably cut at a uniform depth or at a varying depth. For example, an approximate center of the intermediate portion in the longitudinal direction of the base member may preferably have a deeper cut, hence, be cut deeper, than other portions of the base member.

The preferred embodiments of the present invention further provide a method of adjusting a resonant frequency of a piezoelectric resonator including a base member having a longitudinal direction, a plurality of inner electrodes disposed substantially perpendicularly to the longitudinal direction of the base member at intervals in the longitudinal direction of the base member, a first external electrode and a second external electrode located on a surface of the base member and connected to the plurality of electrodes, the base member including a plurality of laminated piezoelectric layers, the plurality of piezoelectric layers being polarized in the longitudinal direction of the base member, and the plurality of inner electrodes being located on surfaces of the plurality of piezoelectric layers so as to be substantially perpendicular to the longitudinal direction of the base member, the method comprising a step of cutting an intermediate portion in the longitudinal direction of the base member in order to adjust a resonant frequency of the piezoelectric resonator.

In the method according to this preferred embodiment, the cutting step includes a step of cutting the intermediate portion in the longitudinal direction of the base member at a uniform depth or at a varying depth. The cutting step includes, for example, a step of making a cut in an approximate center of the intermediate portion in the longitudinal direction of the base member such that the cut forms a recess that is deeper than other portions of the base member.

The piezoelectric resonator according to a preferred embodiment of the present invention is a stiffened type resonator and has piezoelectric layers in which the vibration direction, the direction of polarization, and the direction in which an electric field is applied are the same. Therefore, as compared with an unstiffened piezoelectric resonator, in which the vibration direction differs from the direction of polarization and the electric field, the stiffened piezoelectric resonator has a larger electromechanical coupling coefficient and a larger frequency difference ΔF between the resonant frequency and the antiresonant frequency. In addition, vibrations in modes such as the width and thickness modes, which are different from longitudinal vibration, are unlikely to occur in the stiffened piezoelectric resonator.

Further, the frequency of a piezoelectric resonator having a small spurious resonance and a large difference ΔF between the resonant frequency and the antiresonant frequency can be easily and accurately adjusted to a low frequency. Therefore, the yield of the piezoelectric resonator is significantly improved.

Since a chip-type electronic component can be produced with the use of a piezoelectric resonator according to preferred embodiments of the present invention, the electronic component is easily mounted on a circuit board.

Other features and advantages of the present invention will become apparent from the following description of the invention which refers to the accompanying drawings.

DETAILED DESCRIPTION OF PREFERRED EMBODIMENTS

Figure 1:
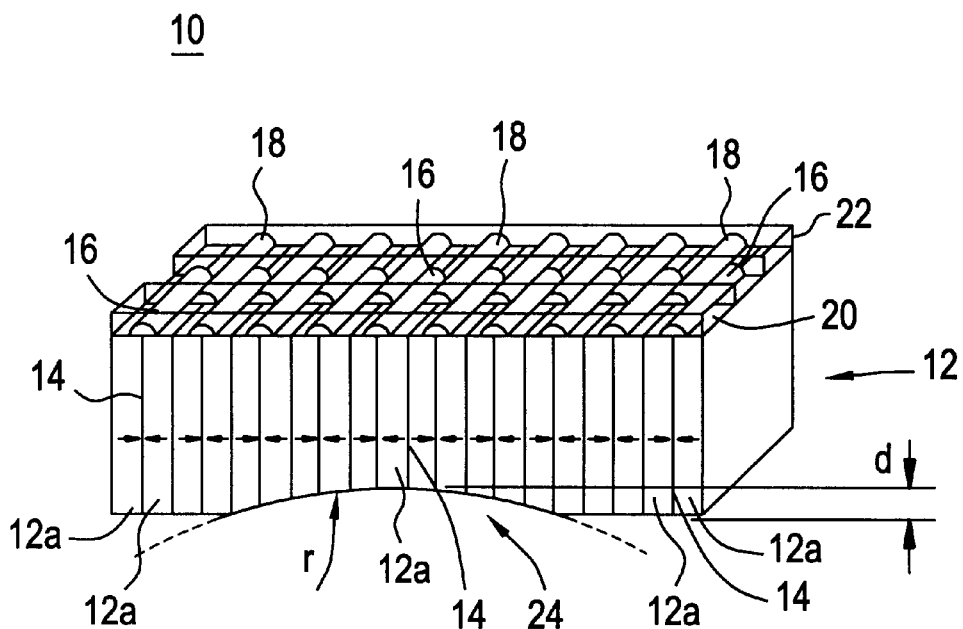
FIG. 1 is a view of a piezoelectric resonator according to a preferred embodiment of the present invention.

FIG. 1 is a view of a piezoelectric resonator according to a preferred embodiment of the present invention. The piezoelectric resonator 10 shown in FIG. 1 preferably includes a substantially rectangular-parallelepiped-shaped base member 12 measuring, for example, about 4.8 mm by about 1 mm by about 1 mm. The base member 12 includes a plurality, for example, twenty, laminated piezoelectric layers 12a made from, for example, piezoelectric ceramic material or other suitable material. The piezoelectric layers 12a are preferably constructed to have the same dimensions. The piezoelectric layers 12a are polarized in a longitudinal direction of the base member 12 such that adjacent piezoelectric layers 12a have opposite directions of polarization as shown by arrows in FIG. 1.

Inner electrodes 14 are disposed between each of the plurality of piezoelectric layers 12a of the base member 12. The inner electrodes 14 are disposed substantially perpendicularly to the longitudinal direction of the base member 12 at certain intervals in the longitudinal direction of the base member 12. Each of the inner electrodes 14 is disposed along an entire main surface, respectively, of the piezoelectric layers 12a. Therefore, the inner electrodes 14 are disposed so as to be exposed at four side surfaces of the base member 12.

On one side surface of the base member 12, one end of an edge of each alternate inner electrode 14 is covered by a first insulating film 16, and the other end of an edge of each of the other alternate inner electrodes 14 is covered by a second insulating film 18.

On the side surface of the base member 12, a first external electrode 20 is disposed on the insulating film 16 located on the alternate inner electrodes 14 such that the external electrode 20 is connected to the other alternate inner electrodes 14. On the side surface of the base member 12, a second external electrode 22 is disposed on the insulating film 18 located on the other alternate inner electrodes 14 such that the external electrode 22 is connected to the alternate inner electrodes 14.

At an intermediate portion in the longitudinal direction on the side surface opposing the side surface of the base member 12 described above, a cut section 24 having, for example, an arc cross section is formed. In this preferred embodiment, the cut section 24 is formed such that an approximate center of the intermediate portion in the longitudinal direction of the base member 12 has a cut or recess that is deeper than any other recess or surface in the base member. This cut section 24 is provided for adjusting the resonant frequency or the antiresonant frequency of the piezoelectric resonator 10 to achieve a low frequency.

Figure 2:
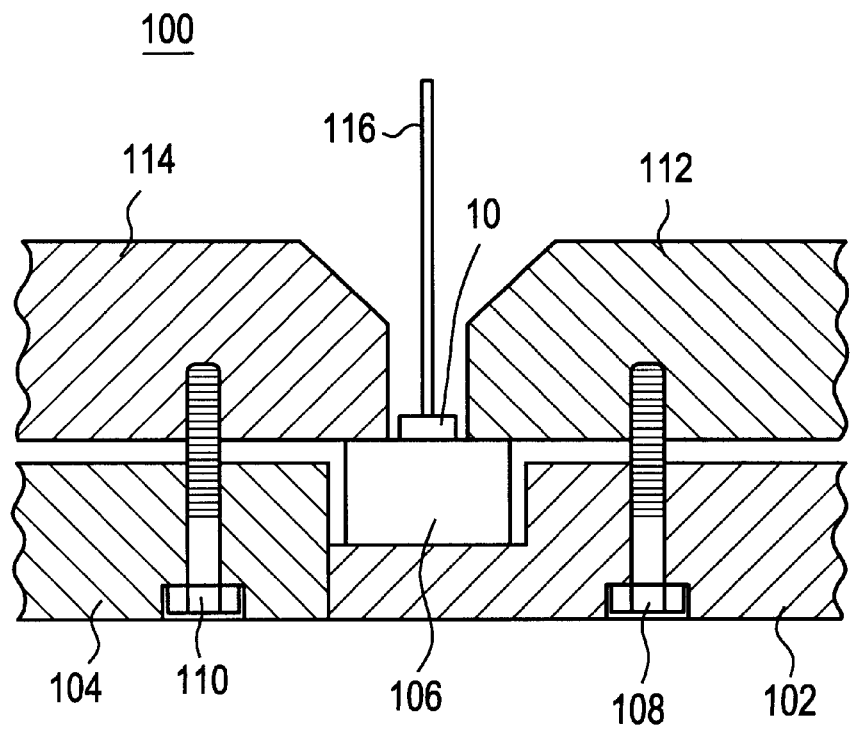
FIG. 2 is a view showing a cutting machine for forming a cut section at the base member of a piezoelectric resonator according to a preferred embodiment of the present invention.

The cut section 24 is formed, for example, by a cutting machine 100 shown in FIG. 2. The cutting machine 100 shown in FIG. 2 has two securing tables 102 and 104. On the securing table 102, a holding jig 106 for holding the piezoelectric resonator 10 with, for example, adhesive is disposed. Pressing members 112 and 114 are secured to the two securing tables 102 and 104 via securing screws 108 and 110, respectively, and the holding jig 106 is pressed down by the pressing members 112 and 114. Above the holding jig 106, a diamond wheel 116 is rotatably and movably mounted. The cut section 24 is formed by pressing the rotating diamond wheel 116 against the piezoelectric resonator 10 held by the holding jig 106.

The piezoelectric resonator 10 uses the first and second external electrodes 20 and 22 as input and output electrodes. When a signal is applied to the first and second external electrodes 20 and 22, since an electric field is applied between adjacent inner electrodes 14, the piezoelectric layers 12a of the base member 12, except the piezoelectric layers 12a disposed at both ends of the base member 12, become piezoelectrically active. Since voltages are applied in opposite directions to the piezoelectric layers 12a such that adjacent piezoelectric layers 12a are polarized in opposite directions, the piezoelectric layers 12a expand and contract in the same direction at the same time in a manner such that the base member 12 expands and contracts in one direction as a whole. In other words, an AC electric field in the longitudinal direction of the base member 12 is applied to each piezoelectric layer 12a by the inner electrodes 14 connected to the external electrodes 20 and 22 to generate a driving force for contraction and expansion in each piezoelectric layer 12a. Therefore, the entire piezoelectric resonator 10 vibrates in the longitudinal direction in the fundamental longitudinal vibration mode such that a vibration node which experiences a minimum or no vibration is defined at a center portion of the base member 12 in the longitudinal direction.

In the piezoelectric resonator 10, the polarization direction of the piezoelectric layers 12a, the applied electric field direction created by an input signal, and the direction of vibration in the piezoelectric layers 12a are all the same. In other words, the piezoelectric resonator 10 is a stiffened type resonator. The piezoelectric resonator 10 has a larger electromagnetic coupling coefficient than an unstiffened piezoelectric resonator, in which the direction of vibration differs from the direction of polarization and electric field. Therefore, the piezoelectric resonator 10 has a larger frequency difference ΔF between the resonant frequency and the antiresonant frequency than the conventional unstiffened piezoelectric resonator. This means that the piezoelectric resonator 10 obtains wide frequency-band characteristics as compared with the conventional unstiffened piezoelectric resonator.

Figure 3:
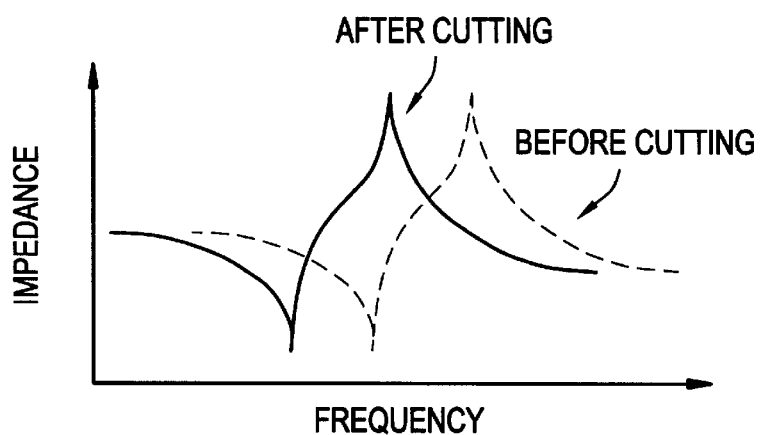
FIG. 3 is a graph showing the frequency characteristic of the piezoelectric resonator shown in FIG. 1, obtained before a cut section is formed (before cutting) and the frequency characteristic obtained after the cut section has been formed (after cutting) according to a method of a preferred embodiment of the present invention.
Figure 20:
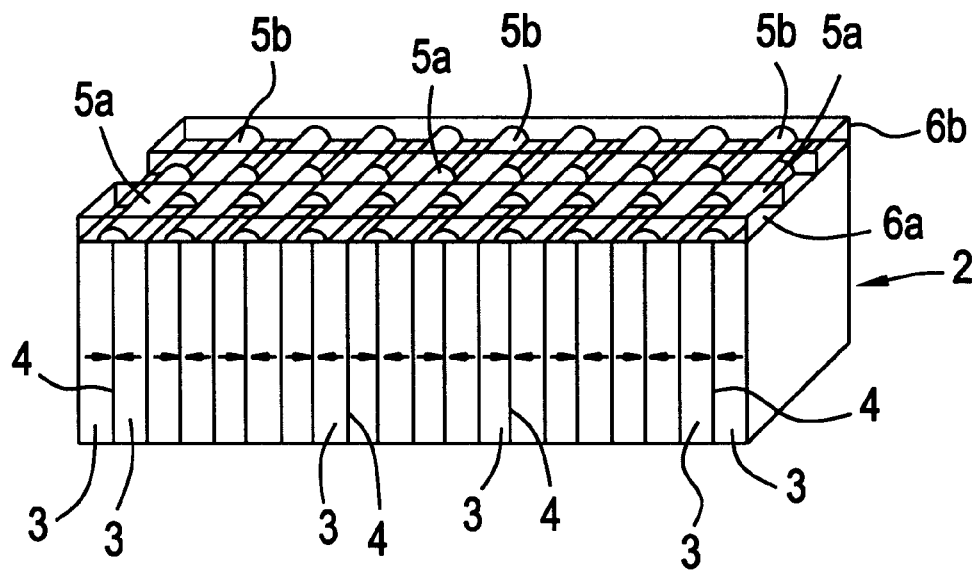
FIG. 20 is a view of a lamination-structure piezoelectric resonator relating to a background of the present invention.

In the piezoelectric resonator 10 shown in FIG. 1, the cut section 24 is formed at the intermediate portion in the longitudinal direction of the base member 12 and thereby, the frequency is adjusted to a desirable low frequency, as compared with the piezoelectric resonator 1 shown in FIG. 20. FIG. 3 shows the frequency characteristic of the piezoelectric resonator 10 shown in FIG. 1, obtained before the cut section 24 is formed (before cutting) and the frequency characteristic obtained after the cut section 24 is formed (after cutting).

Figure 4:
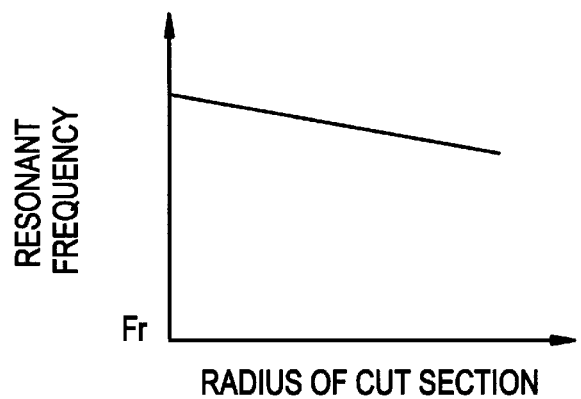
FIG. 4 is a graph showing the relationship between the radius "r" of the cut section and the resonant frequency Fr in the piezoelectric resonator shown in FIG. 1.
Figure 5:
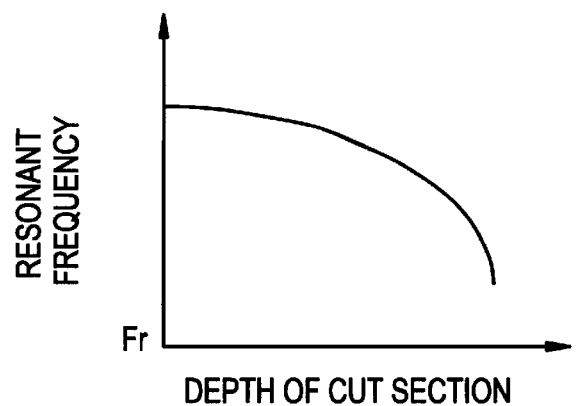
FIG. 5 is a graph showing the relationship between the depth "d" of the cut section and the resonant frequency Fr in the piezoelectric resonator shown in FIG. 1.

FIG. 4 shows the relationship between the radius "r" of the cut section 24 and the resonant frequency Fr in the piezoelectric resonator 10 shown in FIG. 1. FIG. 5 shows the relationship between the depth "d" of the cut section 24 and the resonant frequency Fr in the piezoelectric resonator 10 shown in FIG. 1. Other frequencies of the piezoelectric resonator 10 shown in FIG. 1, such as the antiresonant frequency Fa, vary in the same way as the resonant frequency Fr according to the radius "r" and the depth "d" of the cut section 24.

In the piezoelectric resonator 10, the capacitance of the resonator can be adjusted by changing, for example, the opposing area of the inner electrodes 14, the number of the piezoelectric layers 12a, or the number of the inner electrodes 14, or the dimensions of the piezoelectric layers 12a in the longitudinal direction of the base member 12. In other words, the capacitance can be increased by increasing the opposing area of the inner electrodes 14, the number of the piezoelectric layers 12a, or the number of the inner electrodes 14, or by decreasing the dimensions of the piezoelectric layers 12a in the longitudinal direction of the base member 12. Conversely, the capacitance of the resonator can be reduced by reducing the opposing area of the inner electrodes 14, the number of the piezoelectric layers 12a, or the number of the inner electrodes 14, or by increasing the dimensions of the piezoelectric layers 12a in the longitudinal direction of the base member 12. Therefore, by adjusting the opposing area of the inner electrodes 14, the number of the piezoelectric layers 12a, the number of the inner electrodes 14, or the dimensions of the piezoelectric layers 12a in the longitudinal direction of the base member 12, the capacitance is adjusted. As a result, a high degree of freedom for capacitance design is achieved in the piezoelectric resonator according to preferred embodiments of the present invention. Therefore, it is easy to achieve impedance matching with an external circuit when the piezoelectric resonator 10 is mounted on a circuit board.

Figure 6:
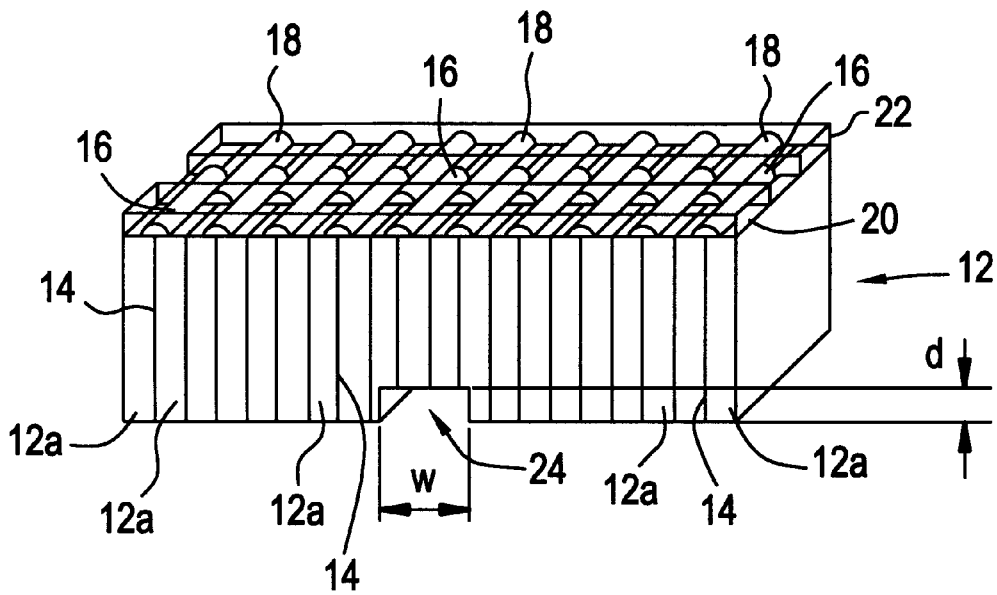
FIG. 6 is a view of a piezoelectric resonator according another preferred embodiment of the present invention.

FIG. 6 is a view of a piezoelectric resonator according to another preferred embodiment of the present invention. In the piezoelectric resonator shown in FIG. 6, a cut section 24 is preferably formed to have a substantially rectangular shape in cross section at an intermediate portion in the longitudinal direction of a base member 12, as compared with the piezoelectric resonator shown in FIG. 1. This cut section 24 can also be formed by the cutting machine 100 shown in FIG. 2.

Figure 7:
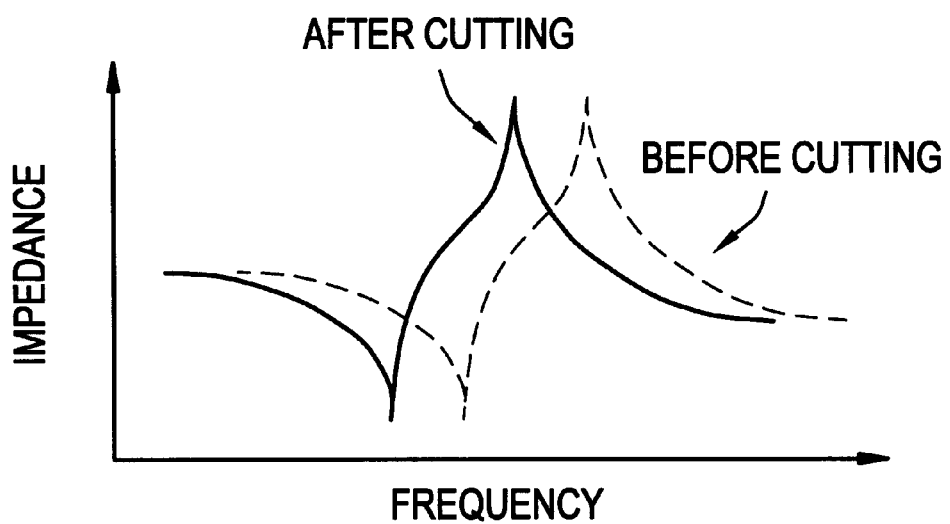
FIG. 7 is a graph showing the frequency characteristic of the piezoelectric resonator shown in FIG. 6, obtained before a cut section is formed (before cutting) and the frequency characteristic obtained after the cut section has been formed (after cutting).

The piezoelectric resonator shown in FIG. 6 obtains the same frequency as the piezoelectric resonator shown in FIG. 1, with substantially half the depth "d" of the cut section 24. Therefore, it has another advantage that the frequency can be adjusted to a lower frequency in relation to the depth "d" of the cut section 24. FIG. 7 shows the frequency characteristic of the piezoelectric resonator 10 shown in FIG. 6, obtained before the cut section 24 is formed (before cutting) and the frequency characteristic obtained after the cut section 24 is formed (after cutting).

Figure 8:
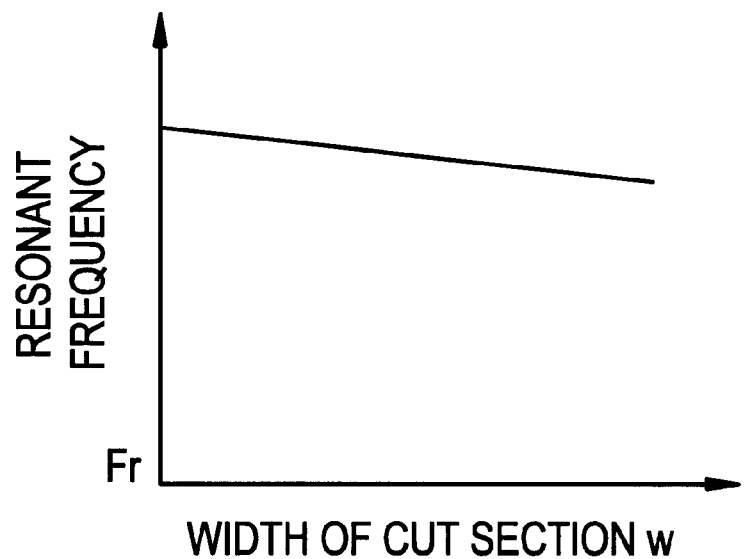
FIG. 8 is a graph showing the relationship between the width "w" of the cut section and the resonant frequency Fr in the piezoelectric resonator shown in FIG. 6.
Figure 9:
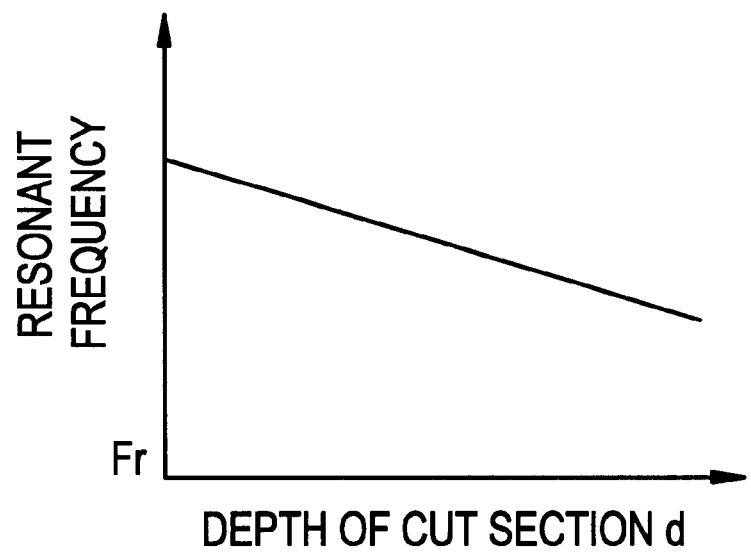
FIG. 9 is a graph showing the relationship between the depth "d" of the cut section and the resonant frequency Fr in the piezoelectric resonator shown in FIG. 6.

FIG. 8 shows the relationship between the width "w" of the cut section 24 and the resonant frequency Fr in the piezoelectric resonator 10 shown in FIG. 6. FIG. 9 shows the relationship between the depth "d" of the cut section 24 and the resonant frequency Fr in the piezoelectric resonator 10 shown in FIG. 6. Other frequencies of the piezoelectric resonator 10 shown in FIG. 6, such as the antiresonant frequency Fa, vary in the same way as the resonant frequency Fr according to the width "w" and the depth "d" of the cut section 24.

Figure 10:
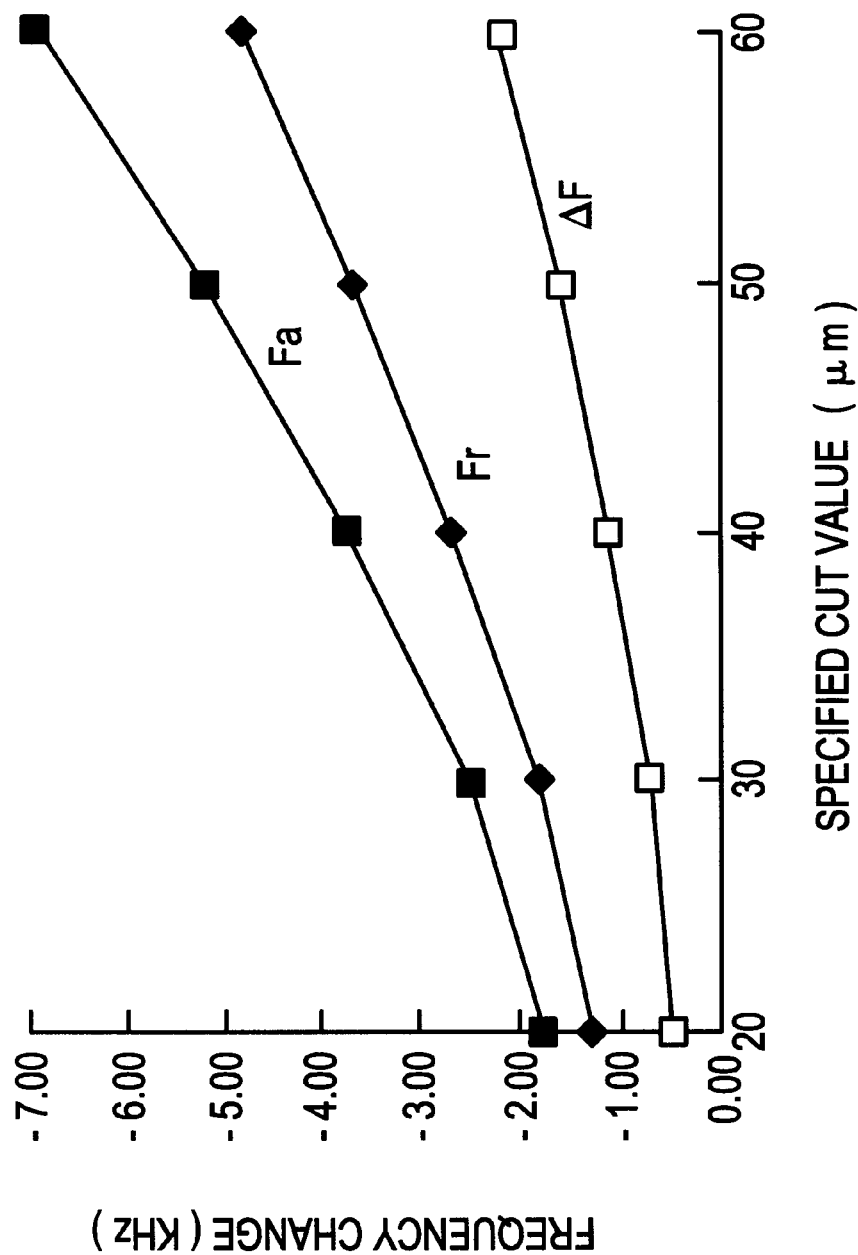
FIG. 10 is a graph showing the relationship between the resonant frequency Fr, the antiresonant frequency Fa, and the difference ΔF therebetween in the piezoelectric resonator 10 shown in FIG. 6, and the specified cut value of the cut section and a frequency change.

FIG. 10 shows the relationship between the resonant frequency Fr, the antiresonant frequency Fa, and the difference ΔF therebetween in the piezoelectric resonator 10 shown in FIG. 6, and the specified cut value (μm) of the cut section 24 and a frequency change (kHz).

Figure 11:
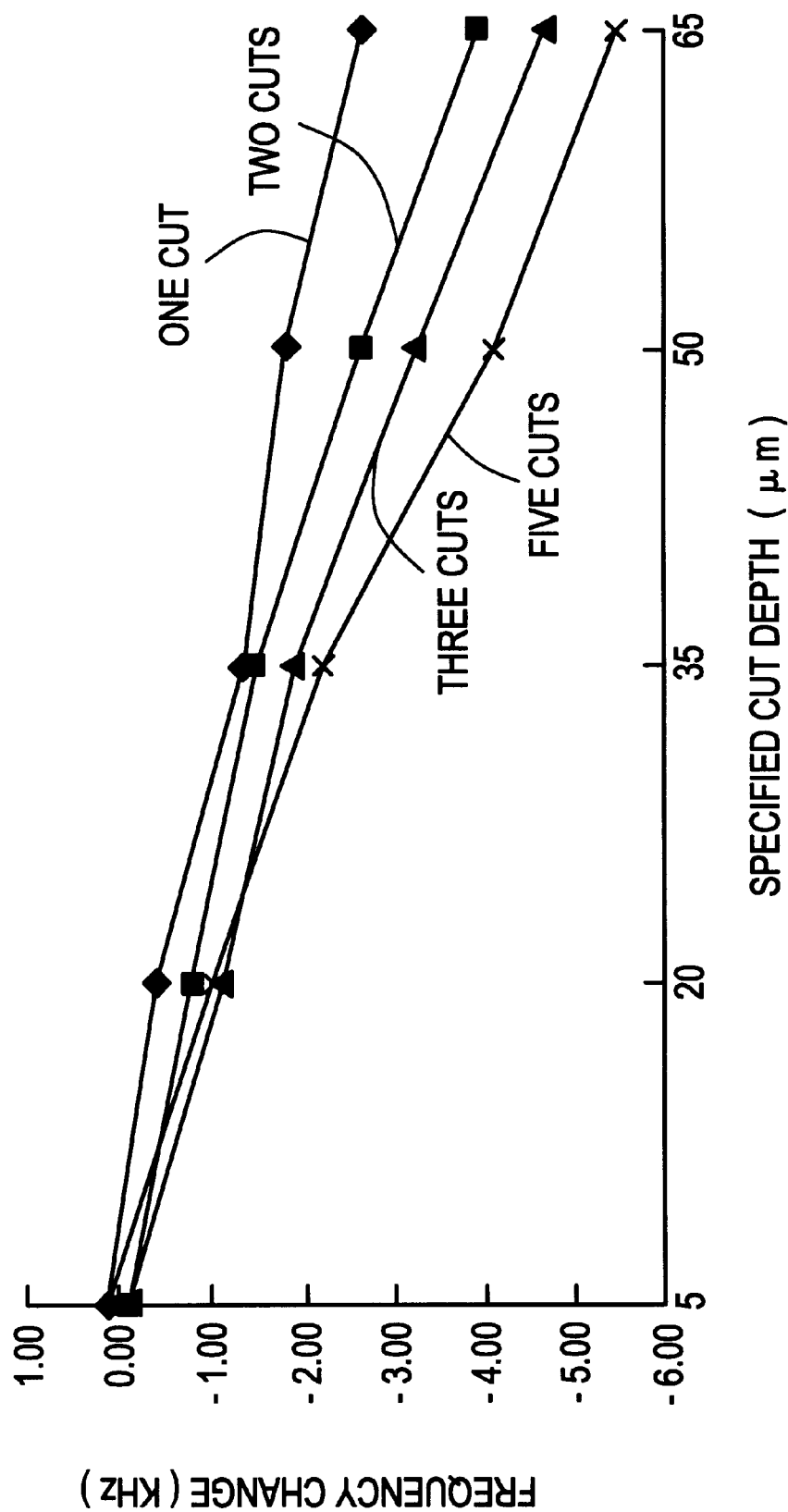
FIG. 11 is a graph showing the relationship between the specified cut depth of the cut section and a frequency change of the resonant frequency Fr in the piezoelectric resonator 10 shown in FIG. 6, with the cut section having different widths formed with the number of cuts being set to one, two, three, and five.
Figure 12:
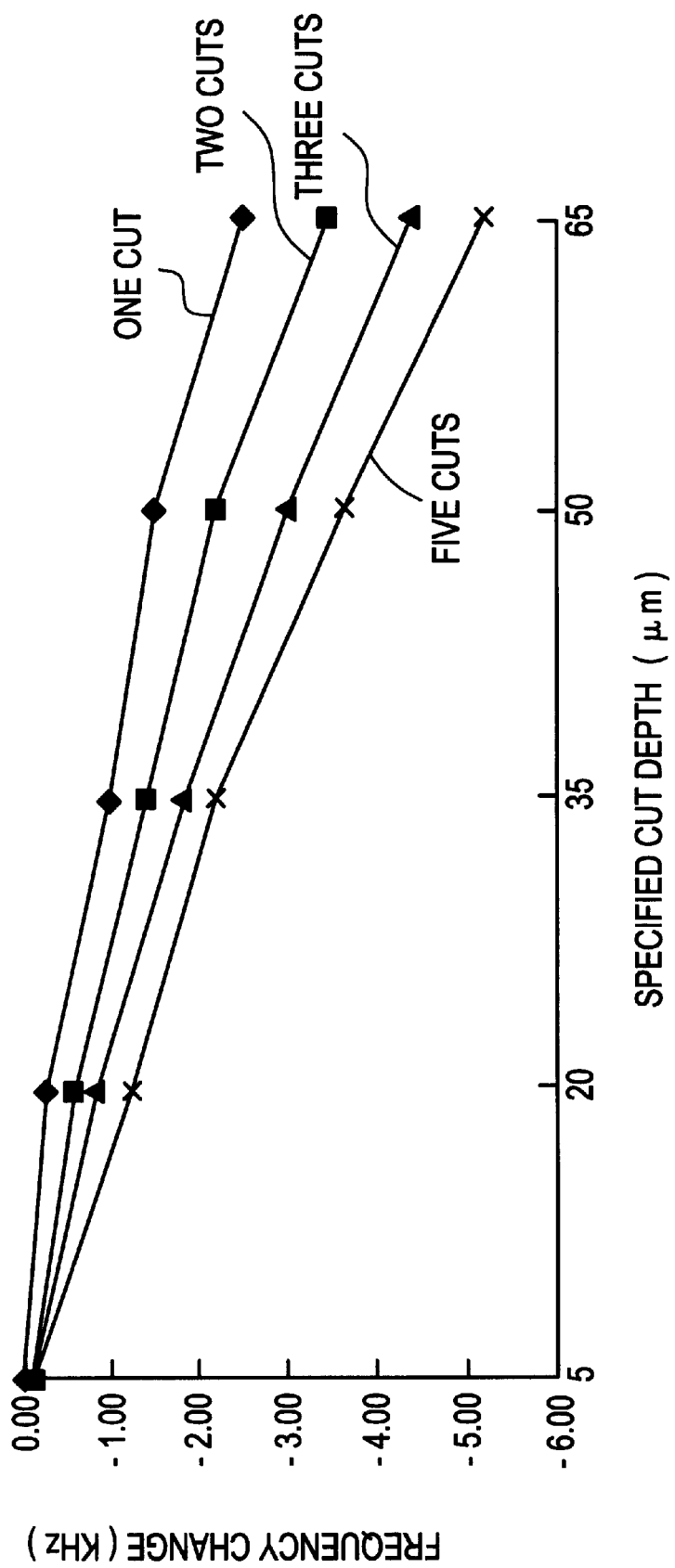
FIG. 12 is a graph showing the relationship between the specified cut depth of the cut section and a frequency change of the antiresonant frequency Fa, with the width of the cut section being formed differently with the number of cuts being set to one, two, three, or five.
Figure 13:
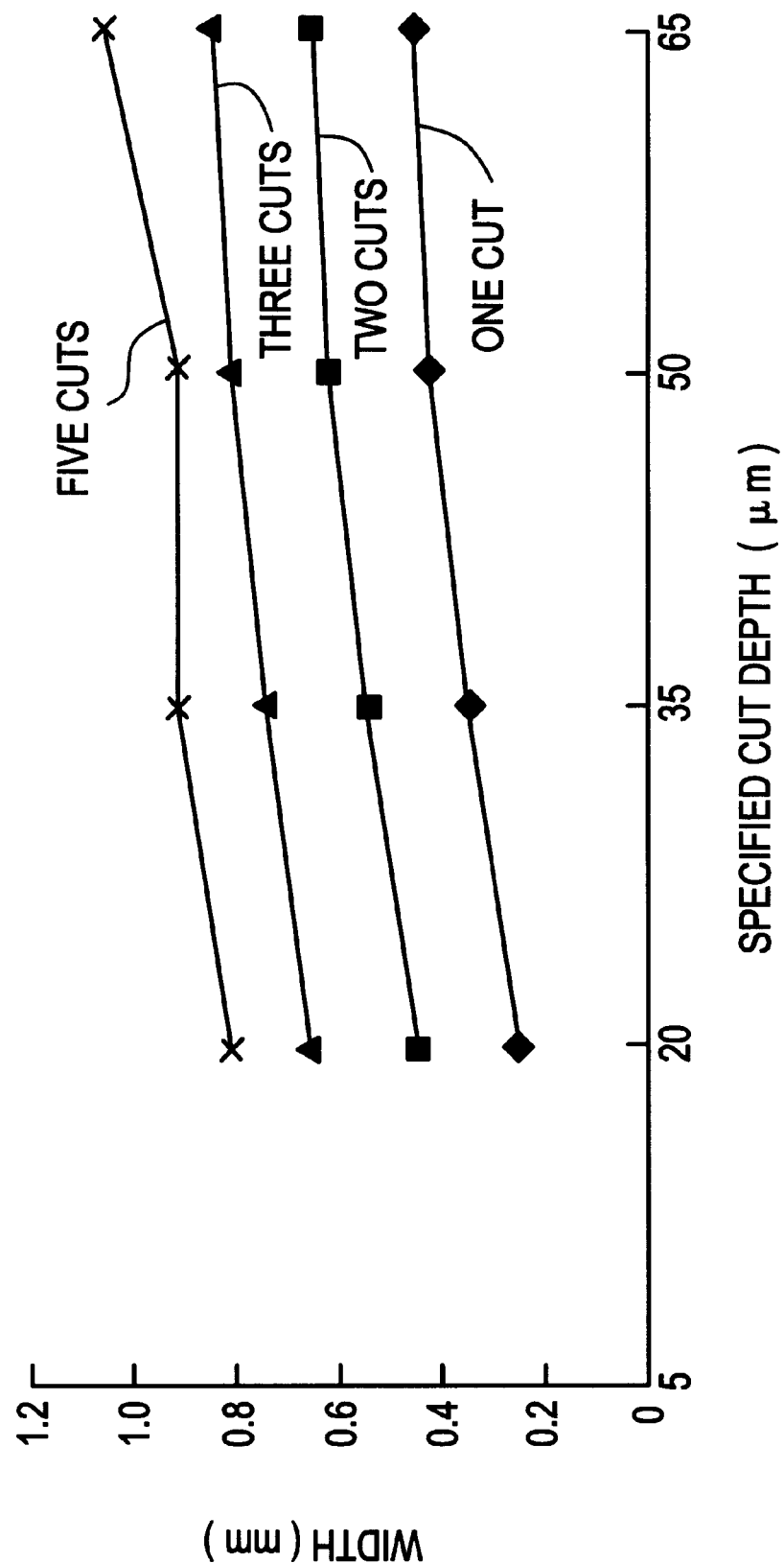
FIG. 13 is a graph showing the relationship between the specified cut depth and the actual width of the cut section.
Figure 14:
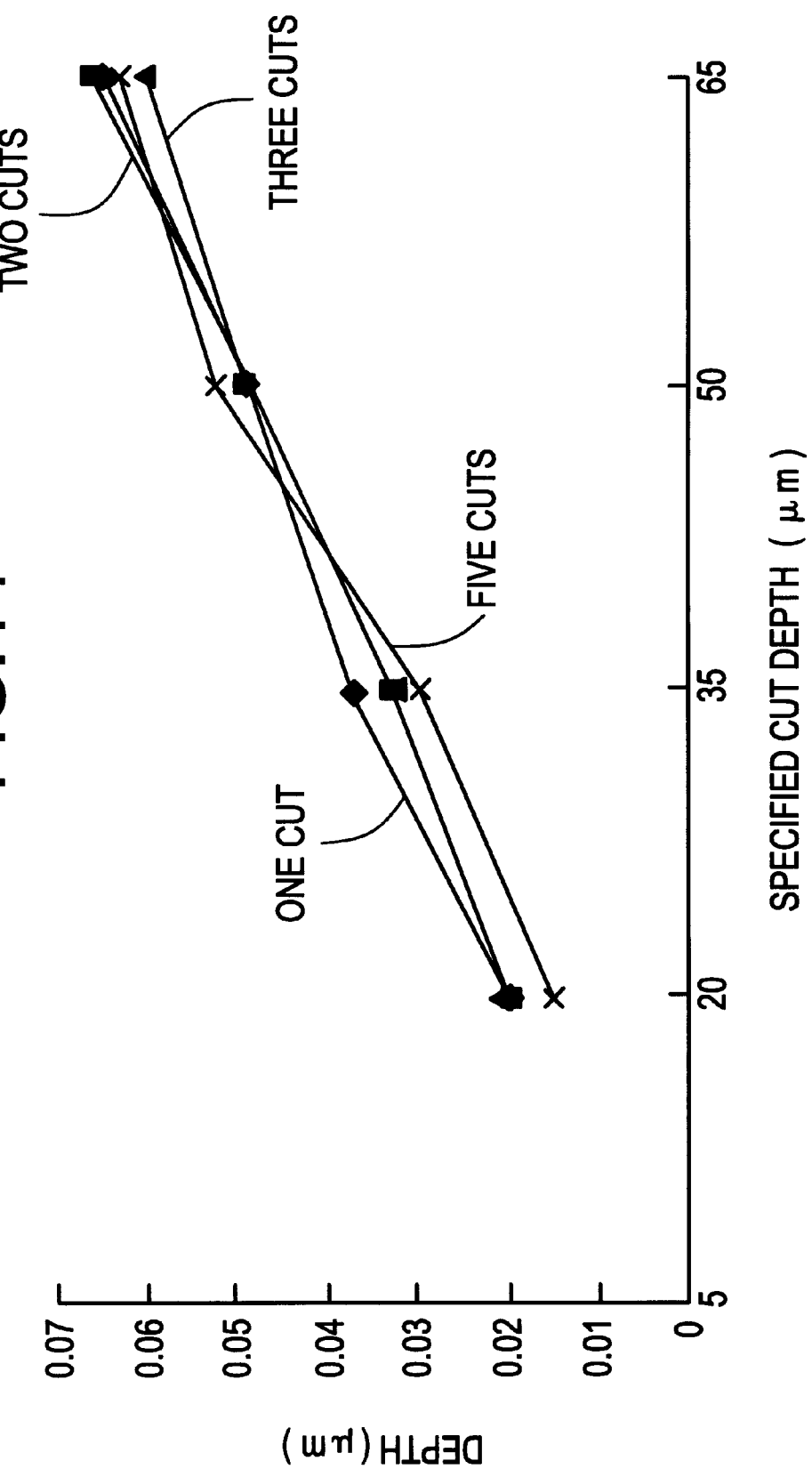
FIG. 14 is a graph showing the relationship between the specified cut depth and the actual depth of the cut section.

FIG. 11 shows the relationship between the specified cut depth (μm) of the cut section 24 and a frequency change (kHz) of the resonant frequency Fr in the piezoelectric resonator 10 shown in FIG. 6, with the cut section 24 having different widths formed by the cutting machine 100 shown in FIG. 2, with the number of cuts being set to one, two, three, and five. FIG. 12 shows the relationship in the above case between the specified cut depth (μm) of the cut section 24 and a frequency change (kHz) of the antiresonant frequency Fa. FIG. 13 shows the relationship between the specified cut depth (μm) shown in FIGS. 11 and 12 and the actual width (mm) of the cut section 24. FIG. 14 shows the relationship between the specified cut depth (μm) shown in FIGS. 11 and 12 and the actual depth (μm) of the cut section 24.

Figure 15:
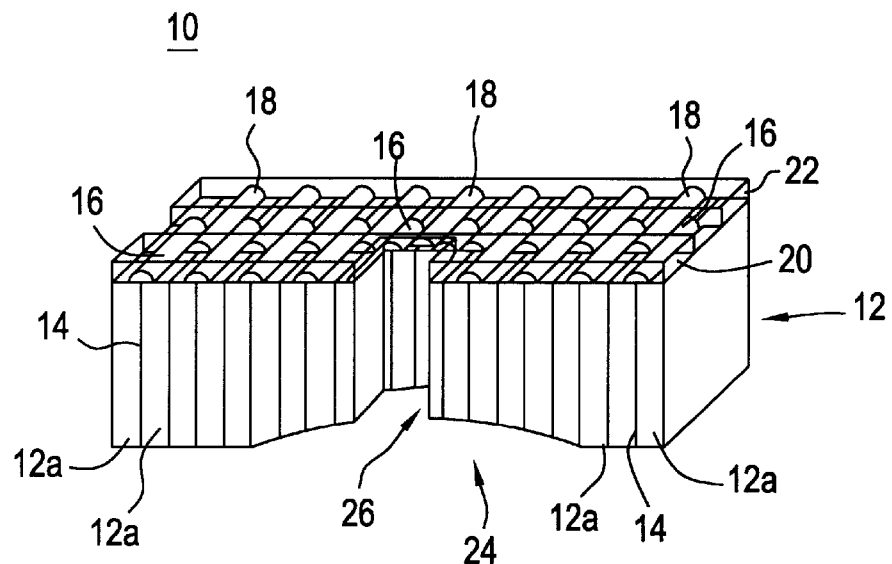
FIG. 15 is a view of a piezoelectric resonator according to still another preferred embodiment of the present invention.

FIG. 15 is a view of a piezoelectric resonator according to still another preferred embodiment of the present invention. In the piezoelectric resonator shown in FIG. 15, another cut section 26 is also formed in a rectangular cross section on another side surface at an intermediate portion in the longitudinal direction of a base member 12, as compared with the piezoelectric resonator shown in FIG. 1. This cut section 26 can also be formed by the cutting machine 100 shown in FIG. 2.

Figure 16:
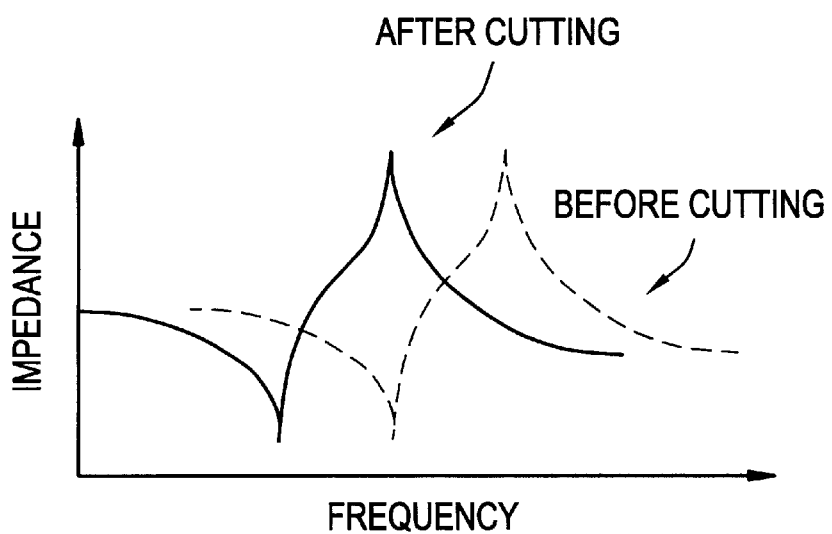
FIG. 16 is a graph showing the frequency characteristic of the piezoelectric resonator shown in FIG. 15, obtained before a cut section is formed (before cutting) and the frequency characteristic obtained after the cut section has been formed (after cutting).

In the piezoelectric resonator shown in FIG. 15, since the cut sections are not concentrated at one side surface of the base member 12 as compared with the piezoelectric resonators shown in FIGS. 1 and 6, it has another advantage that an increased strength is provided. FIG. 16 shows the frequency characteristic of the piezoelectric resonator 10 shown in FIG. 15, obtained before the cut sections 24 and 26 are formed (before cutting) and the frequency characteristic obtained after the cut sections 24 and 26 have been formed (after cutting).

Figure 17:
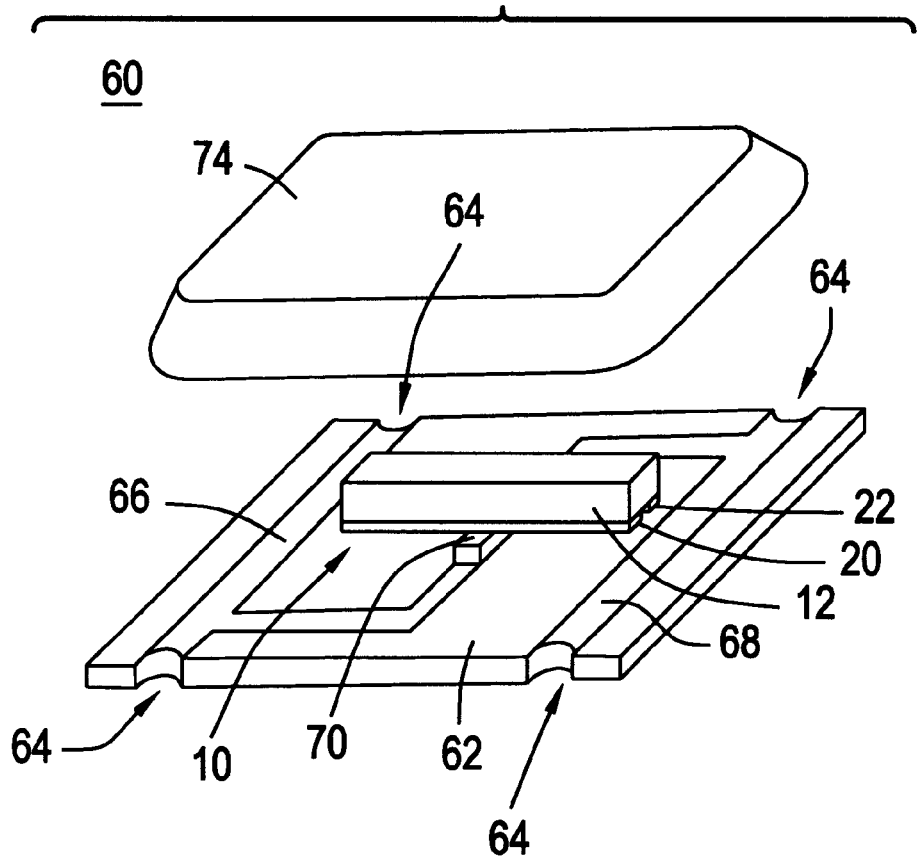
FIG. 17 is a view of an electronic component including a piezoelectric resonator according to another preferred embodiment of the present invention.

Using each of the above piezoelectric resonators 10, electronic components such as oscillators and discriminators are produced. FIG. 17 is a view of an electronic component 60. The electronic component 60 includes an insulating substrate 62 serving as a support member. At each of two opposing end portions of the insulating substrate 62, two indentations 64 are formed. On one surface of the insulating substrate 62, two pattern electrodes 66 and 68 are provided. One pattern electrode 66 is located between opposing indentations 64 and extends in an L-shaped manner from a point near one end toward the center of the insulating substrate 62. The other pattern electrode 68 is located between the other opposing indentations 64 and extends in an L-shaped manner from a point near the other end toward the center of the insulating substrate 62. The pattern electrodes 66 and 68 are arranged such that they are routed in a roundabout fashion from the indentations 64 of the insulating substrate 62 to the opposite surface.

Figure 18:
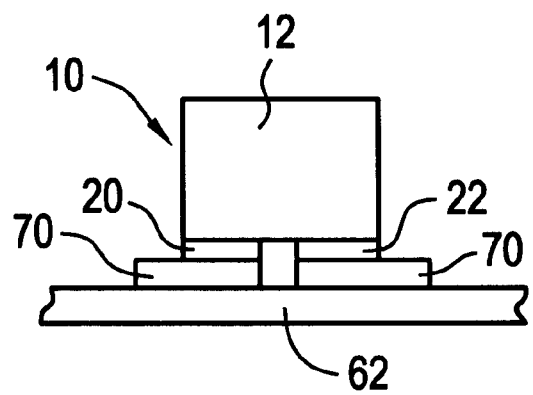
FIG. 18 is a side view showing a method for mounting the piezoelectric resonator shown in FIG. 17.

At the end of each of the pattern electrodes 66 and 68 disposed at the center of the insulating substrate 62, protrusions 70 serving as a mounting member are formed with electrically conductive adhesive. The above-described piezoelectric resonator 10 is mounted on the protrusions 70 such that the center of the base member 12 is disposed on the protrusions 70. As shown in FIG. 18, the first and second external electrodes 20 and 22 of the piezoelectric resonator 10 are, for example, bonded to the protrusions 70. The protrusions 70 may be provided in advance on the piezoelectric resonator 10.

A metal cap 74 is placed on the insulating substrate 62. To prevent the metal cap 74 from being short-circuited to the pattern electrodes 66 and 68, an insulation such as an insulating resin is preferably applied to the insulating substrate 62 and the pattern electrodes 66 and 68. The metal cap 74 is covered to complete the electronic component 60. The electronic component 60 uses the pattern electrodes 66 and 68, which are arranged such that they are routed to the rear surface from the indentations 64 of the insulating substrate 62, as input and output terminals for connection to an external circuit.

Since the protrusions 70 are provided and the center of the piezoelectric resonator 10 is secured to the protrusions 70 in this electronic component 60, the ends of the piezoelectric resonator 10 are disposed separately from the insulating substrate 62, so vibration is not prevented. Excited longitudinal vibration is not weakened or hindered because the center of the piezoelectric resonator 10, which serves as a vibration node, is secured to the protrusions 70.

The electronic component 60 is mounted on a circuit board together with IC chips and other components to form an oscillator or a discriminator. Since the electronic component 60 having such a structure is sealed and protected by the metal cap 74, it can be used as a chip-type component which can be mounted by reflow soldering or other suitable process.

When the electronic component 60 is used in an oscillator, spurious vibrations are suppressed to a low level and unusual vibration caused by the spurious vibrations are prevented due to the features of the piezoelectric resonator 10 used in the electronic component 60. It is also easy to achieve impedance matching with an external circuit since the capacitance of the piezoelectric resonator 10 can be easily and accurately set to any desired value. Especially when the electronic component is used for an oscillator for voltage-controlled oscillation, a wide frequency range which cannot be obtained conventionally is acquired due to a large ΔF of the resonator.

When the electronic component 60 is used for a discriminator, a wide peak-separation range is provided due to a large ΔF of the resonator. In addition, since the resonator provides a wide capacitance range in a design stage, it is easy to achieve impedance matching with an external circuit.

The above electronic component is formed in a chip shape. In the present invention, it can have shapes other than a chip shape.

Figure 19A:
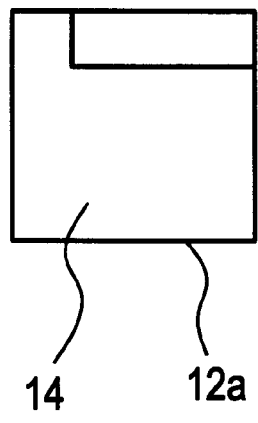
FIGS. 19(a) and 19(b) are plan views of modifications of the inner electrodes used for the piezoelectric resonator.
Figure 19B:
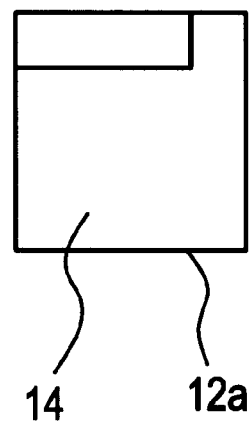

In each of the above piezoelectric resonators 10, the inner electrodes 14 are disposed to cover the whole areas of main surfaces of the piezoelectric layers 12. In the present invention, the electrodes may be disposed such that alternate inner electrodes 14 are disposed on main surfaces excluding one end portion of the piezoelectric layers 12a as shown in FIG. 19(a) and the other alternate inner electrodes 14 are disposed on main surfaces excluding the other end portion of the piezoelectric layers 12a as shown in FIG. 19(b). When the inner electrodes 14 are formed in this way, since, on one side surface of the base member 12, the alternate inner electrodes 14 are not exposed at one end of the edge and the other alternate inner electrodes 14 are not exposed at the other end of the edge. Thus, the insulating films 16 and 18 are unnecessary.

In the above piezoelectric resonators 10, the plurality of piezoelectric layers 12a are alternately polarized in opposite directions. The polarization directions of the plurality of piezoelectric layers 12a are not limited to this case.

In the above piezoelectric resonators 10, the dimensions of the piezoelectric layers 12a in the longitudinal direction of the base member 12 are the same and the intervals between adjacent inner electrodes 14 are the same. However, the dimensions of the piezoelectric layers 12a and the intervals between adjacent inner electrodes 14 may be different.

In the above piezoelectric resonators 10, one piezoelectric layer 12a is provided between adjacent inner electrodes 14. A plurality of piezoelectric layers may also be provided therebetween.

In the above piezoelectric resonators 10, the first and second external electrodes 20 and 22 are connected to alternate inner electrodes 14, respectively. The first and second alternate inner electrodes may be connected to inner electrodes 14 not arranged alternately.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric resonator including:

a base member having a longitudinal direction;

a plurality of inner electrodes disposed substantially perpendicularly to the longitudinal direction of said base member at intervals in the longitudinal direction of said base member; and a first external electrode and a second external electrode located on a surface of said base member and connected to said plurality of electrodes; wherein said base member includes a plurality of laminated piezoelectric layers polarized in the longitudinal direction of said base member;

said plurality of inner electrodes are located on surfaces of said plurality of piezoelectric layers so as to be substantially perpendicular to the longitudinal direction of said base member;

a cut is provided in an intermediate portion of said base member so that the cut extends along a longitudinal direction thereof and across a plurality of the inner electrodes and a plurality of the piezoelectric layers, the cut being arranged to adjust the resonant frequency of the piezoelectric resonator.

2. The piezoelectric resonator according to claim 1, wherein the cut has a substantially arc-shaped configuration.

3. The piezoelectric resonator according to claim 1, wherein the cut has a substantially rectangular shape.

4. The piezoelectric resonator according to claim 1, wherein the cut extends in a direction which is substantially perpendicular to the longitudinal direction of the base member.

5. The piezoelectric resonator according to claim 1, wherein the cut is provided on a surface of the base member which is disposed opposite to the surface of the base member upon which the first and second external electrodes are located.

6. The piezoelectric resonator according to claim 1, wherein the cut is provided on a surface of the base member which is disposed adjacent to the surface of the base member upon which the first and second external electrodes are located.

7. The piezoelectric resonator according to claim 1, wherein the cut in the intermediate portion in the longitudinal direction of said base member has a uniform depth along an entire dimension thereof.

8. The piezoelectric resonator according to claim 1, wherein the cut in the intermediate portion in the longitudinal direction of said base member has a varying depth.

9. The piezoelectric resonator according to claim 1, wherein a center of the intermediate portion in the longitudinal direction of said base member is thinner than other portions of the base member.

10. A method of adjusting a resonant frequency of piezoelectric resonator including a base member having a longitudinal direction, a plurality of inner electrodes disposed substantially perpendicularly to the longitudinal direction of the base member at intervals in the longitudinal direction of the base member, a first external electrode and a second external electrode located on a surface of said base member and connected to the plurality of electrodes, the base member including a plurality of laminated piezoelectric layers which are polarized in the longitudinal direction of said base member, and the plurality of inner electrodes being located on surfaces of the plurality of piezoelectric layers so as to be substantially perpendicular to the longitudinal direction of the base member; the method comprising a step of cutting an intermediate portion of the base member along the longitudinal direction of the base member so that the cut extends across a plurality of the inner electrodes and a plurality of the piezoelectric layers in order to adjust a resonant frequency of the piezoelectric resonator.

11. The method according to claim 10, wherein the cut has a substantially arc-shaped configuration.

12. The method according to claim 10, wherein the cut has a substantially rectangular shape.

13. The method according to claim 10, wherein the cut extends in a direction which is substantially perpendicular to the longitudinal direction of the base member.

14. The method according to claim 10, wherein the cut is formed on a surface of the base member which is disposed opposite to the surface of the base member upon which the first and second external electrodes are located.

15. The method according to claim 10, wherein the cut is formed on a surface of the base member which is disposed adjacent to the surface of the base member upon which the first and second external electrodes are located.

16. The method according to claim 10, wherein the cut formed in the intermediate portion in the longitudinal direction of said base member has a uniform depth along an entire dimension thereof.

17. The method according to claim 10, wherein the cut in the intermediate portion in the longitudinal direction of said base member has a varying depth.

* * * * *